US006784363B2

(12) United States Patent
Jones

(10) Patent No.: US 6,784,363 B2
(45) Date of Patent: Aug. 31, 2004

(54) EMI SHIELDING GASKET CONSTRUCTION

(75) Inventor: Peter Jones, Londonberry, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/235,986

(22) Filed: Sep. 5, 2002

(65) Prior Publication Data

US 2003/0062180 A1 Apr. 3, 2003

Related U.S. Application Data

(60) Provisional application No. 60/326,550, filed on Oct. 2, 2001.

(51) Int. Cl.$^7$ ............................................. H01B 17/00
(52) U.S. Cl. .............................. 174/35 GC; 174/35 R; 174/35 MS; 174/35 TS; 361/424; 361/400
(58) Field of Search ........................ 174/35 GC, 35 R, 174/35 MS, 35 TS; 361/424, 400

(56) References Cited

U.S. PATENT DOCUMENTS 2,778,868 A    1/1957   Stinger (List continued on next page.)

FOREIGN PATENT DOCUMENTS

| AU | 732032  | 4/1991 |
|----|---------|--------|
| AU | 709051  | 8/1999 |
| AU | 730445  | 3/2001 |
| AU | 179709  | 1/2002 |
| CA | 903020  | 6/1972 |
| CA | 2243213 | 3/1978 |
| CA | 1116650 | 1/1982 |
| CA | 2125742 | 2/2001 |
| DE | G 90 12 936.4 | 1/1991 |
| DE | 197 28 839 C1 | 9/1998 |

(List continued on next page.)

OTHER PUBLICATIONS

Data of Flectron Metallized Materials by Monzanto for "Nickel/Copper Polyester Taffeta" dated Sep. 12, 1995.
Processing of Single and Multi–component Adhesives and Sealants by Paul Ivanfi, together with translation (undated). Applicants request the Examiner to consider this reference as prior art under 102(a), however, Applicants respectfully reserve the right to supplement this Information Disclosure Statement and take a contrary position should it be necessary.

(List continued on next page.)

Primary Examiner—Dean A. Reichard
Assistant Examiner—Jinhee Lee
(74) Attorney, Agent, or Firm—John A. Molnar, Jr.

(57) ABSTRACT

A EMI shielding gasket for interposition between a first and a second part of an electronic device. The gasket includes a foam or like resilient inner member, and an electrically-conductive member, which may be layers of a conductive particle-filled resin. The inner member has opposing first and second surfaces extending along an x and y-axis, and a thickness dimension extending along a normal z-axis and through which is formed a plurality of vias. The electrically-conductive member includes first and second portions, each overlaying at least a part of the corresponding first or second surface and providing electrical conductivity in the direction of the x and y-axes, and third portions each being received in a corresponding one of the vias and providing electrical conductivity between the first and the second portion in the direction of the z-axis.

29 Claims, 1 Drawing Sheet

U.S. PATENT DOCUMENTS

| | | |
|---|---|---|
| 3,140,342 A | 7/1964 | Ehrreich et al. |
| 3,296,356 A | 1/1967 | McAdams |
| 3,576,387 A | 4/1971 | Derby |
| 3,758,123 A | 9/1973 | Ksieski |
| 3,889,043 A | 6/1975 | Ducros |
| 4,178,410 A | 12/1979 | Tomita |
| 4,227,037 A | 10/1980 | Layton |
| 4,396,661 A | 8/1983 | George et al. |
| 4,399,317 A | 8/1983 | Van Dyk, Jr. |
| 4,434,541 A | 3/1984 | Powers, Jr. |
| 4,435,565 A | 3/1984 | Stirling et al. |
| 4,447,484 A | 5/1984 | Slosberg et al. |
| 4,447,492 A | 5/1984 | McKaveney |
| 4,489,126 A | 12/1984 | Holtrop et al. |
| 4,504,607 A * | 3/1985 | Leech .................. 523/427 |
| 4,531,994 A | 7/1985 | Holtrop et al. |
| 4,540,617 A | 9/1985 | Kawanishi et al. |
| 4,545,926 A | 10/1985 | Fouts, Jr. et al. |
| 4,569,304 A | 2/1986 | LeMaitre |
| 4,572,960 A | 2/1986 | Ebneth et al. |
| 4,608,104 A | 8/1986 | Holtrop et al. |
| 4,621,013 A | 11/1986 | Holtrop et al. |
| 4,652,695 A | 3/1987 | Busby |
| 4,659,869 A | 4/1987 | Busby |
| 4,666,765 A | 5/1987 | Caldwell et al. |
| 4,690,778 A | 9/1987 | Narumiya et al. |
| 4,753,840 A | 6/1988 | Van Gompel |
| 4,780,575 A | 10/1988 | Flavin et al. |
| 4,797,171 A | 1/1989 | Van Gompel |
| 4,857,668 A | 8/1989 | Buonanno |
| 4,871,477 A | 10/1989 | Dimanshteyn |
| 4,913,157 A | 4/1990 | Pratt, Jr. et al. |
| 4,937,128 A | 6/1990 | Quiles |
| 4,952,448 A | 8/1990 | Bullock et al. |
| 4,968,854 A | 11/1990 | Benn, Sr. et al. |
| 4,988,550 A | 1/1991 | Keyser et al. |
| 5,008,485 A | 4/1991 | Kitagawa |
| 5,009,927 A | 4/1991 | Cloyd et al. |
| 5,014,160 A * | 5/1991 | McCoy, Jr. .................. 361/818 |
| 5,028,739 A | 7/1991 | Keyser et al. |
| 5,039,825 A | 8/1991 | Samarov |
| 5,045,635 A | 9/1991 | Kaplo et al. |
| 5,068,493 A | 11/1991 | Benn, Sr. et al. |
| 5,089,325 A | 2/1992 | Covey |
| 5,105,056 A | 4/1992 | Hoge, Jr. et al. |
| 5,107,070 A | 4/1992 | Benn, Sr. et al. |
| 5,115,104 A | 5/1992 | Bunyan |
| 5,122,411 A | 6/1992 | Iwamoto et al. |
| 5,142,101 A | 8/1992 | Matsuzaki et al. |
| 5,147,121 A | 9/1992 | McIlwraith |
| 5,150,282 A | 9/1992 | Tomura et al. |
| 5,160,807 A | 11/1992 | Fry et al. |
| 5,166,864 A | 11/1992 | Chitwood et al. |
| 5,185,654 A | 2/1993 | Mosher et al. |
| 5,202,536 A | 4/1993 | Buonanno |
| 5,204,403 A | 4/1993 | Furuta et al. |
| RE34,393 E | 9/1993 | McIlwraith |
| 5,260,513 A | 11/1993 | Giles et al. |
| 5,266,354 A | 11/1993 | Tohyama et al. |
| 5,326,414 A | 7/1994 | Mosher et al. |
| 5,498,467 A | 3/1996 | Meola |
| 5,512,709 A | 4/1996 | Jencks et al. |
| 5,518,758 A | 5/1996 | Tiburtius et al. |
| 5,522,602 A | 6/1996 | Kaplo et al. |
| 5,524,908 A | 6/1996 | Reis |
| 5,566,055 A | 10/1996 | Salvi, Jr. |
| 5,578,790 A | 11/1996 | Peregrim |
| 5,603,514 A | 2/1997 | Jencks et al. |
| 5,612,092 A | 3/1997 | Strenger et al. |
| 5,614,306 A | 3/1997 | Jobe et al. |
| 5,635,252 A | 6/1997 | Fraser, Jr. et al. |
| 5,641,438 A | 6/1997 | Bunyan et al. |
| 5,641,544 A | 6/1997 | Melancon et al. |
| 5,646,369 A | 7/1997 | Miska et al. |
| 5,674,606 A | 10/1997 | Powers, Jr. |
| 5,678,699 A | 10/1997 | Gebka |
| 5,700,532 A | 12/1997 | Chiou |
| 5,709,766 A | 1/1998 | Press et al. |
| 5,731,073 A | 3/1998 | Knott et al. |
| 5,731,541 A | 3/1998 | Bernd et al. |
| 5,847,317 A | 12/1998 | Phelps |
| 5,855,818 A | 1/1999 | Gan et al. |
| 5,882,729 A | 3/1999 | Kahl et al. |
| 5,886,413 A | 3/1999 | Knott et al. |
| 5,910,524 A | 6/1999 | Kalinoski |
| 6,056,527 A | 5/2000 | Bunyan et al. |
| 6,096,158 A | 8/2000 | Kahl et al. |
| 6,096,413 A | 8/2000 | Kalinoski et al. |
| 6,121,545 A | 9/2000 | Peng et al. |
| 6,258,203 B1 * | 7/2001 | Rokman et al. ............ 156/296 |
| 6,312,550 B1 | 11/2001 | Tiburtius et al. |

FOREIGN PATENT DOCUMENTS

| | | |
|---|---|---|
| EP | 0 326 441 | 8/1989 |
| EP | 0 643 551 A1 | 3/1995 |
| EP | 0 643 552 A1 | 3/1995 |
| EP | 0 654 962 A1 | 5/1995 |
| EP | 0 895 449 A2 | 2/1999 |
| EP | 1 041 869 A2 | 10/2000 |
| EP | 0 804 868 B1 | 3/2001 |
| EP | 1 094 257 A2 | 4/2001 |
| EP | 1 099 541 A1 | 5/2001 |
| FR | 2 308 030 | 11/1996 |
| JP | 02270390 A2 | 11/1990 |
| JP | 7177/1993 | 1/1993 |
| WO | WO 93/23226 | 11/1993 |
| WO | WO 95/02953 | 1/1995 |
| WO | WO 95/07603 | 3/1995 |
| WO | WO 96/22672 | 7/1996 |
| WO | WO 97/26782 | 7/1997 |
| WO | WO 98/47340 | 10/1998 |
| WO | WO 989/54942 | 12/1998 |
| WO | WO 99/40769 | 8/1999 |
| WO | WO 99/43191 | 8/1999 |

OTHER PUBLICATIONS

Article by Shu H. Peng and W. S. Vincent Teng of Chomerics Parker–Hannifin Corporation entitled "Recent Development in Elastomeric EMI Shielding Gasket Design" (undated). Applicants request the Examiner to consider this reference as prior art under 102(a), however, Applicants respectfully reserve the right to supplement this Information Disclosure Statement and take a contrary position should it be necessary.

Parker Seals brochure entitled Parshield Conductive Elastomers, dated Jun., 1993.

Gaskets that Block EMI by John Severinsen dated Aug. 7, 1975.

Technology Information of Vanguard for Ultra–Vanshield Gaskets (undated). Applicants request the Examiner to consider this reference as prior art under 102(a), however, Applicants respectfully reserve the right to supplement this Information Disclosure Statement and take a contrary position should it be necessary.

Chomerics Technical Bulletin 13 for CHO–SEAL® Aerospace–200 Grade dated Jan. 11, 1995.

Chomerics Technical Bulletin 20 for Commercial Grade Conductive Elastomer Extrusions with Pressure–Sensitive Adhesive Attachment System, dated Feb. 1, 1997.

Chomerics Technical Bulletin 22 for CHO–SHIELD® EMI Shielding Covers dated 1996.

Chomerics Technical Bulletin 58 for CHO–SEAL® 1285 Conductive Elastomer with Improved Corrosion Resistance dated Jan. 11, 1995.

Chomerics EMI Shielding for Commercial Electronics (undated). Applicants request the Examiner to consider this reference as prior art under 102(a), however, Applicants respectfully reserve the right to supplement this Information Disclosure Statement and take a contrary position should it be necessary.

Chomerics EMI Shielding Engineering Handbook (undated). Applicants request the Examiner to consider this reference as prior art under 102(a), however, Applicants respectfully reserve the right to supplement this Information Disclosure Statement and take a contrary position should it be necessary.

Chomerics EMI Shielding for Military/Aerospace Electronics Engineering Handbook (undated). Applicants request the Examiner to consider this reference as prior art under 102(a), however, Applicants respectfully reserve the right to supplement this Information Disclosure Statement and take a contrary position should it be necessary.

Chomerics Soft–Shield® Low closure force EMI gaskets dated 1997.

Chomerics EMI Shielding and Grounding Spacer Gaskets dated 1996.

Chomerics Preliminary Product Data Sheet for Soft-–Shield® 5500 dated 1998.

Chomerics Information Technology Shielding and Grounding (undated). Applicants request the Examiner to consider this reference as prior art under 102(a), however, Applicants respectfully reserve the right to supplement this Information Disclosure Statement and take a contrary position should it be necessary.

Chomerics Soft–Shield® 2000 Series Low Closure Force, Foam Core EMI Gaskets (undated). Applicants request the Examiner to consider this reference as prior art under 102(a), however, Applicants respectfully reserve the right to supplement this Information Disclosure Statement and take a contrary position should it be necessary.

Chomerics Soft–Shield® Gaskets Low Closure Force, Foam Core EMI Gaskets (undated). Applicants request the Examiner to consider this reference as prior art under 102(a), however, Applicants respectfully reserve the right to supplement this Information Disclosure Statement and take a contrary position should it be necessary.

Chomerics Soft–Shield® 4000 Series Low Closure Force, Foam Core EMI Gaskets (undated). Applicants request the Examiner to consider this reference as prior art under 102(a), however, Applicants respectfully reserve the right to supplement this Information Disclosure Statement and take a contrary position should it be necessary.

Chomerics Soft–Shield® 5000 Series Low Closure Force, Foam Core EMI Gaskets (undated). Applicants request the Examiner to consider this reference as prior art under 102(a), however, Applicants respectfully reserve the right to supplement this Information Disclosure Statement and take a contrary position should it be necessary.

Chomerics Soft–Shield® 1000 Series Low Closure Force, Foam Core EMI Gaskets (undated). Applicants request the Examiner to consider this reference as prior art under 102(a), however, Applicants respectfully reserve the right to supplement this Information Disclosure Statement and take a contrary position should it be necessary.

Chomerics CHO–SHIELD® Conductive Coatings (undated). Applicants request the Examiner to consider this reference as prior art under 102(a), however, Applicants respectfully reserve the right to supplement this Information Disclosure Statement and take a contrary position should it be necessary.

Rogers Corporation Poron® Cellular Urethane Foams Sealing and Gasketing Design Guide dated Oct. 1998.

Rogers Corporation Poron Materials Products (undated). Applicants request the Examiner to consider this reference as prior art under 102(a), however, Applicants respectfully reserve the right to supplement this Information Disclosure Statement and take a contrary position should it be necessary.

Rogers Corporation Poron® Cellular Urethane Foam Unsupported Industrial Materials Typical Physical Properties© 1998, 2001.

Chomerics Technical Bulletin 25 CHO–SEAL® 3000 Series Low Closure Force, Conductive Elastomer EMI Gaskets © 1996.

Laird Technologies Electrically Conductive Elastomers—ElectroCoat (undated). Applicants request the Examiner to consider this reference as prior art under 102(a), however, Applicants respectfully reserve the right to supplement this Information Disclosure Statement and take a contrary position should it be necessary.

Spira Manufacturing Corporation O–Ring Spira–Combo (undated). Applicants request the Examiner to consider this reference as prior art under 102(a), however, Applicants respectfully reserve the right to supplement this Information Disclosure Statement and take a contrary position should it be necessary.

Chomerics Technical Bulletin 27 CHO–WELT 2099 (undated). Applicants request the Examiner to consider this reference as prior art under 102(a), however, Applicants respectfully reserve the right to supplement this Information Disclosure Statement and take a contrary position should it be necessary.

IBM Technical Bulleting vol. 20, No. 1, dated Jun. 1977.

IBM Technical Disclosure Bulleting vol. 17, No. 9 dated Feb. 1975.

* cited by examiner

EMI SHIELDING GASKET CONSTRUCTION

CROSS-REFERENCE TO RELATED CASES

The present application claims the benefit of the filing date of U.S. Provisional Application Serial No. 60/326,550; filed Oct. 2, 2001, the disclosure of which is expressly incorporated herein by reference.

BACKGROUND OF THE INVENTION

The present invention relates broadly to gaskets for providing electromagnetic interference (EMI) shielding and dust or other environmental sealing, and particularly to a gasket which is especially adapted for use within electronic devices and enclosures, and for other applications requiring a low closure force and cost-effective shielding solution.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. EMI shielding gaskets and other electrically-conductive materials, their methods of manufacture, and their use are further described in U.S. Pat. Nos. 6,121,545; 6,096,413; 6,075,205; 5,996, 220; 5,910,524; 5,902,956; 5,902,438; 5,882,729; 5,804, 762; 5,731,541; 5,641,438; 5,603,514; 5,584,983; 5,578, 790; 5,566,055; 5,524,908; 5,522,602; 5,512,709; 5,438, 423; 5,202,536; 5,142,101; 5,141,770; 5,136,359; 5,115, 104; 5,107,070; 5,105,056; 5,068,493; 5,054,635; 5,049, 085; 5,028,739; 5,008,485; 4,988,550; 4,968,854; 4,952, 448; 4,931,479; 4,871,477; 4,857,668; 4,800,126; 4,301, 040; 4,231,901; and 3,758,123, in International Patent Appln. Nos. WO 00/23,513; 99/44,406; 98/54942; and 96/22672; Japanese Patent Publication (Kokai) No. 7177/ 1993; German Patent No. 19728839; Canadian Patent No. 903,020; in Severinsen, J., "Gaskets That Block EMI," Machine Design, Vol. 47, No. 19, pp. 74–77 (Aug. 7, 1975); in "Electrically-Conductive Elastomers-ElectroCoat," Laird Technologies, Delaware Water Gap, Pa.; and in the following publications of the Chomerics Division of Parker Hannifin Corporation, Woburn, Mass.: "SOFT-SHIELD® 1000 Series;" "SOFT-SHIELD® 2000 Series;" "SOFT-SHIELD® 4000 Series;" "SOFT-SHIELD® 5000 Series;" and "SOFT-SHIELD® 5500, Preliminary Product Data Sheet (1998) Series."

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, or silicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

Requirements for many shielding applications, such as involving access or door panels, back or face planes, I/O connector panels, and the like, shielding, specify a low impedance, low profile gasket which is deflectable under relatively low closure force loads, e.g., about 1.0–8.0 lbs per inch (0.2–1.5 kg per cm) of gasket length. Usually, a minimum deflection, typically of about 10%, also is specified to ensure that the gasket sufficiently conforms to the mating housing, board, panel, or other surfaces to develop an electrically conductive pathway therebetween.

As electronic devices continue to proliferate, it is believed that additional EMI shielding alternatives and options therefor would be well-received by the electronics industry.

BROAD STATEMENT OF THE INVENTION

The present invention is directed to a gasket construction for electromagnetic interference (EMI) shielding and dust or other environmental sealing, and which is especially adapted for use in low closure force applications. The gasket construction includes a resilient inner member and an electrically-conductive member which may be coated or otherwise bonded or applied as a layer to specified surfaces of the inner member.

In an illustrative embodiment especially suited for low closure force applications, the inner member is provided as a strip or sheet of an open or closed-cell polyurethane, silicone, neoprene, or other elastomeric foam or other resilient polymeric material. For improved tear resistance and strength, the foam may be reinforced, for example, with a layer of a polymeric film which is bonded to one or both of the upper or lower surfaces of the foam. A plurality of vias, which may be generally cylindrical, are formed through the thickness dimension of the foam.

The electrically-conductive member, which may be the cured film or other layer of an admixture of a resin, such as an epoxy, acrylic, polyurethane, or silicone, and one or more electrically-conductive particulate fillers, is coated on the top and bottom surfaces of the foam sheet or strip, or if a reinforcement is used, on the surface thereof, and also on the inner peripheral surfaces of the vias to provide electrical conductivity along a z-axis between the coating layers on the top and bottom surfaces of the foam. Thus, when compressed intermediate interfacing surfaces of an electronic device or other EMI shielded assembly, the gasket of the invention provides electrical continuity therebetween through the z-axis of the gasket as well as across the top and bottom surfaces of the foam.

Advantageously, by virtue of the z-axis conductivity being provided through the vias of the foam, the edges of the gasket need not be coated, wrapped, or otherwise covered with a conductive material to otherwise provide conductivity through the thickness dimension of the gasket. Accordingly, the gasket of the invention may be produced in sheets or strips which then may be die-cut or otherwise sectioned into complex shapes or patterns of any dimension, and including internal apertures, without the need to pre-size the width of the gasket or to coat or wrap the gasket after cutting in a separation operation. Thus, the gasket of the invention is particularly economical, and may be used in a variety of configurations, such as sheets, strips, pads, picture-frames, and die-cut patterns, thin or thick cross-sections, and shielding and/or grounding applications such as for door or access panels, card cages, vents, covers, PCMCIA cards, back or face planes, or I/O connector panels.

The present invention, accordingly, comprises the articles and methods of manufacture possessing the construction, combination of elements, and arrangement of parts and steps which are exemplified in the detailed disclosure to follow. Advantages of the present invention include a gasket construction which is economical to manufacture, and which may be produced in strip, sheet, pad or other form, and in a variety of sizes, thicknesses, and shapes gasket profile for a host of EMI shielding and/or grounding applications. These and other advantages will be readily apparent to those skilled in the art based upon the disclosure contained herein.

BRIEF DESCRIPTION OF THE DRAWING

For a fuller understanding of the nature and objects of the invention, reference should be had to the following detailed description taken in connection with the accompanying drawing wherein.

Figure 1:
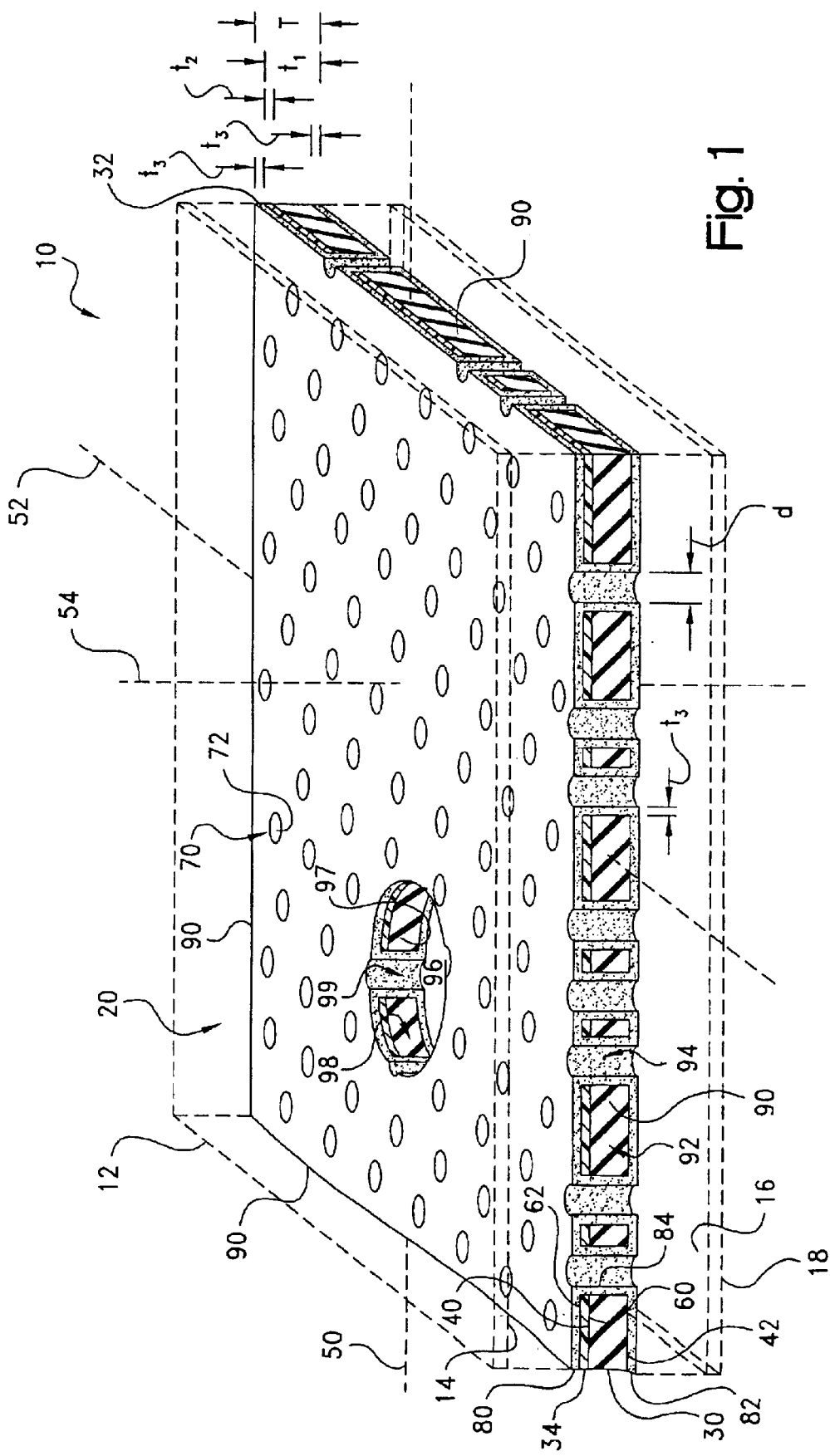
FIG. 1 is a perspective "exploded" view of a representative EMI shielding assembly illustrative of an application of the EMI shielding gasket of the present invention.

The drawing will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of article and method of the invention herein involved are described in connection with its manufacture for use as an EMI shielding gasket such as for the door or access panels, circuit boards, card cages, vents, covers, PCMCIA cards, back or face planes, shielding caps or cans, or I/O connector panels of an electronic device, or of an enclosure or cabinet therefor such a device or other equipment. Further, the term "EMI shielding" should be understood to include, and to be used interchangeably with, electromagnetic compatibility (EMC), surface grounding, corona shielding, radio frequency interference (RFI) shielding, and anti-static, i.e., electro-static discharge (ESD) protection. In view of the discourse to follow, however, it will be appreciated that aspects of the present invention may find utility in other applications requiring a resilient, electrically conductive seal, gasket, fencing, or other connection, screen, or shield for EMI shielding or other purpose. Use within those such other applications therefore should be considered to be expressly within the scope of the present invention.

Referring then to the figures wherein corresponding reference characters are used to designate corresponding elements throughout the several views with equivalent elements being referenced with prime or sequential alphanumeric designations, a representative EMI shielding assembly is shown generally at 10 in the exploded view of FIG. 1 as including a first component or part, depicted in phantom at 12, which may be a door or access panel of a housing or other enclosure of an electronic device or cabinet therefor or for other equipment, or, alternatively, a circuit board, frame, keypad, spacer, vent, cover, back or face plane, shielding cap or can, I/O connector panel, or the like. The device which includes part 12 may be a cellular telephone handset or, alternatively another handheld device such as a personal communications services (PCS) handset, PCMCIA card, global positioning system (GPS), personal digital assistant (PDA), or other another device such as a personal or laptop computer, a radio receiver or transmitter, a network server, cellular communication base station, or other telecommunications equipment, and indoor or outdoor cabinet, or other equipment or device. Part 12 has an interface surface, 14, which may oppose a mating or other corresponding interface surface, 16, of another component or part, referenced in phantom at 18, of the device, cabinet, or equipment.

For many applications, parts 12 and 18 may be injection or otherwise molded of a thermoplastic or other polymeric material such as a poly(ether ether ketone), polyimide, high molecular weight polyethylene, polypropylene, polyetherimide, polybutylene terephthalate, nylon, fluoropolymer, polysulfone, polyester, ABS, acetal homo or copolymer, or a liquid crystal polymer. In the case of an electrically-nonconductive material, the interfacing surfaces 14 and 16 may be painted, metallized, or otherwise provided with a metal or metal-filled coating layer. Alternatively, parts 12 and 18 may be formed of a metal such as a steel, magnesium, or aluminum.

A gap-filling or otherwise conformable sheet or strip gasket, referenced generally at 20, constructed in accordance with the present invention as a laminate, composite, or other integral structure is interposed between the interfacing surfaces 14 and 16. As disposed between the interfacing surfaces 14 and 16 for providing electrical continuity between the parts 12 and 18, gasket 20 of the invention is compressible, i.e., deformable or deflectable, axially under a predetermined closure force or other compressive load from an original thickness, referenced at "T," which may be between about 0.015–0.50 inch 0.38–12.7 mm) for many applications, to a compressed thickness which may be between about 80–90% or less of the original thickness T.

Gasket 20 may be retained between the surfaces 14 and 16 in a conventional manner such as by means of a pressure-sensitive (PSA) or other adhesive (not shown) interposed between the gasket 20 and one or both of the surfaces 14 or 16. In the case of a PSA, the adhesive may be coated or otherwise applied to the gasket 20, and thereafter covered with a release sheet for later application to one of the parts 12 or 18. As is detailed further in U.S. Pat. No. 4,988,550, PSA's generally suited for EMI shielding applications include formulations based on silicones, neoprene, styrene butadiene copolymers, acrylics, acrylates, polyvinyl ethers, polyvinyl acetate copolymers, polyisobutylenes, and mixtures, blends, and copolymers thereof. The PSA may be nonconductive or conductive, and in that regard may be formulated as containing about 1–25% by weight of a conductive filler to yield a volume resistivity of between about 0.01–0.001 Ω-cm. The filler may be incorporated in the form of particles, fibers, flakes, microspheres, or microballoons, and may range in size from about 1–100 microns. Typical filler materials include inherently conductive materials such as metals, carbon, and graphite, as well as nonconductive materials such as plastic or glass which are plating or coated with conductive material such as a noble metal or the like. Other adhesives, which similarly may be conductive or non-conductive, such as structural epoxies and urethanes, or thermoplastic hot-melts, also may be employed, as well as mechanical means of attachment such as clips, fasteners, or an interference fit.

In basic construction, gasket 20 comprises a resilient inner member, 30, an adherent, electrically-conductive member, 32, bonded to or otherwise supported on the inner member, and, optionally, a reinforcement member, 34. As may be seen with continuing reference to FIG. 1, inner member 30, which for illustrative purposes is shown as a generally planar sheet or strip of indefinite extents, but which may be of any given extents and shape, includes a first surface, 40, and a second surface, 42, opposite the first surface 40. Surfaces 40 and 42, again for illustrative purposes, are shown to be generally planar in defining, respectively, a first and second side of the sheet or strip of the inner member 30, but alternatively may be multi-planar, arcuate or curved, or complex curved. In whatever geometry provided, each of the surfaces 40 and 42 extends along an x-axis, 50, and a y-axis, 52, disposed generally normal to the x-axis, 50, and defines with the other surface a thickness dimension, referenced at "$t_1$," of the inner member 30 therebetween which extends along a z-axis, 54, disposed generally normal to the x-axis and a y-axes 50 and 52. For many applications, the inner member thickness $t_1$ may be between about 10–1000 mils (0.254–25.4 mm), and typically, but not necessarily, will be small relative to the extents of the lengthwise or widthwise dimensions of the gasket 20 as defined along, respectively, the x and y-axes 50 and 52. When configured as a strip-type gasket, the lengthwise extent of the gasket 20 along the x-axis 50 will be large relative to the widthwise extent along the y-axis 52.

Inner member 30 may be formed of an elastomeric material which specifically may be selected as depending upon one or more of operating temperature, compression set, force defection, flammability, compression set, or other chemical or physical properties. Depending, then, upon the application, suitable materials may include, natural rubbers such as Hevea, as well as thermoplastic, i.e., melt-processible, or thermosetting, i.e., vulcanizable, synthetic rubbers such as fluoropolymers, chlorosulfonates, polybutadienes, buna-N, butyls, neoprenes, nitrites, polyisoprenes, silicones, fluorosilicones, copolymer rubbers such as ethylene-propylene (EPR), ethylenepropylene-diene monomer (EPDM), nitrile-butadienes (NBR) and styrene-butadienes (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, styrene-isoprene-styrene (SIS), and styrene-butadiene-styrene (SBS), as well as other polymers which exhibit rubber-like properties such as plasticized nylons, polyesters, ethylene vinyl acetates, polyolefins, and polyvinyl chlorides. As used herein, the term "elastomeric" is ascribed its conventional meaning of exhibiting rubber-like properties of compliancy, resiliency or compression deflection, low compression set, flexibility, and an ability to recover after deformation.

Although the material forming the inner member 30 may be unfoamed, it may be preferred for affording gap-filling capabilities in low closure force applications, i.e. between about 1–8 lb/inch (0.2–1.5 N/mm), that the material be an open or closed cell foam. In the EMI shielding applications herein involved, foams generally are observed to complaint over a wide range of temperatures, and to exhibit good compression-relaxation hysteresis even after repeated cyclings or long compressive dwells. Inner member 30 therefore particularly may be formed of a foamed elastomeric thermoplastic such as a polyethylene, polypropylene, polypropylene-EPDM blend, butadiene, styrene-butadiene, nitrile, chlorosulfonate, or a foamed neoprene, urethane, or silicone. Preferred materials include open or closed cell urethanes or blends such as a polyolefin resin/monoolefin copolymer blend, or a neoprene, silicone, or nitrile sponge rubber. An especially preferred material is an open cell, extra low modulus polyurethane having an average cell size of about 100 μm and, as may be measured, for example, in accordance with ASTM D 3574-95, a density of between about 15–30 lbs/ft$^3$, a compression set of less than about 10%, and a force-deflection of between about 1–9 psi (7–63 kPa). Such materials are marketed under the name Poron® 4700 by Rogers Corporation, Woodstock, Conn.

For improved tear resistance and strength, the inner member 30 may be supported on or otherwise incorporate the reinforcement layer 34 which itself has an inner surface, 60, and an opposing outer surface, 62, which define a thickness dimension, referenced at "$t_2$," of the member therebetween which for many applications may be between about 1–10 mils (0.0254–0.254 mm). In the arrangement shown in FIG. 1, inner member 30 may be cast or otherwise formed directly on a sheet or other layer of the reinforcement member 34 to effect the bonding, via mechanical, chemical, electrostatic, adhesive, attractive, and/or other forces, of the inner surface 60 thereof to the inner member first surface 40. Of course, the reinforcement member 34 alternatively, or additionally as a second sheet, may be bonded to or otherwise made integral with the inner member second surface 42, or otherwise may be incorporated into the inner member as one or more interlayers.

In the embodiment 10 of FIG. 1, the reinforcement member 34 is shown to be provided as a 1–5 mil (0.0254–0.127 mm) thick film or other layer of a thermoplastic material such as a polyimide, polyethylene terephthalate (PET), polyetheretherketone (PEEK), or the like. Alternatively, the reinforcement member 34 may be provided as a layer of a fiberglass, synthetic or natural fiber, or metal wire cloth, screen, mesh, or other fabric, or as a layer of an aluminum or other metal foil. As mentioned the reinforcement member 34 may be used to improve the physical strength of the inner member 30 and otherwise to facilitate the handling thereof and its die cutting into a variety of geometries.

In further accordance with the precepts of the present invention, inner member 30 is formed or otherwise provided as having a plurality of vias, one of which is referenced at 70, formed through the first and second surfaces 40 and 42 and the thickness dimension therebetween and, as shown, through the thickness dimension of the optional reinforcement member 34. Each of the vias 70, as is referenced at 72, has an inner peripheral surface which may be generally cylindrical with a generally circular, elliptical, polygonal, or other closed geometric cross-section. The vias 70 may be regularly, i.e., uniformly spaced, or irregularly, i.e., non-uniformly spaced, distributed, and for most applications will have a diametric extent, referenced at "d," of between about 0.015–0.50 mils (0.38–12.7 mm). In this regard, inner member 30 may have a "porosity" or open area of between about 5–20%.

The electrically-conductive member 32 includes a first and second layer portions, referenced at 80 and 82, respectively, each of which overlays and covers at least a part of or, preferably, substantiality the entirety of the corresponding inner member first and second surface 40 and 42. Member 32 additionally includes one or more third layer or other portions, one of which is referenced at 84, which are each contained within a corresponding one of the vias 70. Particularly, the portions 80, 82, and 84 may be coated or otherwise applied or formed, in the case of layer portions 80 and 82, directly on the corresponding inner member surface 40 or 42, or, if a reinforcement member 34 is employed, directly on the outer surface 62 thereof as is shown in FIG. 1, for providing electrical conductivity thereacross in the direction of the x and y-axes 50 and 54. In the case of portion 84, such portion may be formed with one of the other portions 80 and 82 as coated or otherwise applied to cover at least part of or, preferably, substantially the entirety of the inner peripheral surface 72 of a corresponding one of the vias 70 for providing electrical conductivity between the first and second layer portions 80 and 82 in the direction of the z-axis. Although the third portions 84 typically will be provided as a coating or other layer on the surfaces 72 of the vias 70, the portions 84 alternatively may completely fill the vias 70 or be formed by injecting or otherwise filling the inner member 30 with the portions 84 to thereby form those portions simultaneous with the vias 70 in a single operation. Preferably, a third portion 84 will be coated or otherwise contained in each of the vias 70 to thereby better maximize the z-axis conductivity of the gasket 20. When applied as a coating, each of the portions 80, 82, 84 will have a coating, i.e., film, thickness, referenced collectively at "$t_3$" in FIG. 1, of, independently, between about 0.1–10 mils (0.0025–0.25 mm) on the corresponding surface 40, 42, or 72 of the inner member 30.

With the electrically-conductive member 32 being so applied to the inner member 30, gasket 20 may be observed to exhibit an electrical surface resistance, such as in accordance with CHO-TM-TP57 (Chomerics Test Procedure, Parker Chomerics Division, Woburn, Me.), of not greater than about 0.10 Ω/sq. in the direction of the x and y-axes 50 and 52, and a resistance, such as in accordance with Chomerics MAT1002, of not greater than about 0.050 Ω/in (0.050 Ω/mm) in the direction of the z-axis 54. When employed, for example, in the assembly 10 as compressed between the interfacing surfaces 14 and 16 thereof, gasket 20 may be observed to have an EMI shielding effectiveness, such as in accordance with CHO-TM-TP08, of at least about 60 dB substantially over a frequency range of between about 10 MHz and about 10 GHz.

The inner member 30 itself may be formed by casting, extrusion, molding, or other conventional process, and may be integrally bonded to the reinforcement member 34 in such process as being cast, extruded, molded, or otherwise formed thereon. Alternatively, the reinforcement member 34 may be laminated or otherwise bonded to the inner member 30 in a separate operation. The supported inner member 30 so formed then may be stamped, punched, rolled, or otherwise processed to formed the vias 70 therethrough. Thereafter, the material of the electrically-conductive member 32 may be applied to the inner member 30 in a solution or other liquid form by a direct process such as spraying, knife coating, roller coating, brushing, casting, drum coating, dipping, dispensing, extrusion, screen printing, or like, or by an indirect transfer process. The material which is applied to one or both of the surfaces 40 and 42 to form layers of the first and second portions 80 and 82 may also be made to permeate into the vias 70 to form layers of the third portions 84. After coating, the material may be dried or otherwise cured or cooled to develop an adherent film, coating, or other residue of the electrically-conductive member 32 on the inner member 30.

The coating material of the electrically-conductive member 32 may be water-borne, inorganic solvent-based, or based on an organic solvent such as methyl ethyl ketone (MEK), and further may be formulated as a one or two-component air, thermal, moisture, UV, radiation, or other cure system which may include a blend of one or more resins and one or more electrically-conductive fillers. By way of example, the one or more resins may be an acrylic, polyurethane, silicone, fluorosilicone, or epoxy polymer, or a copolymer or blend thereof, and in the cured film or other layer of the electrically conductive member 32 may form a continuous phase or binder for the filler. Elastomeric resins may be considered particularly preferred.

Suitable electrically-conductive fillers include: noble and non-noble metals such as nickel, copper, tin, aluminum, and nickel; noble metal-plated noble or non-noble metals such as silver-plated copper, nickel, aluminum, tin, or gold; non-noble metal-plated noble and non-noble metals such as nickel-plated copper or silver; and noble or non-noble metal plated non-metals such as silver or nickel-plated graphite, glass, ceramics, plastics, elastomers, or mica; and mixtures thereof. The filler is broadly classified as "particulate" in form, although the particular shape of such form is not considered critical to the present invention, and may include any shape that is conventionally involved in the manufacture or formulation of conductive materials of the type herein involved including hollow or solid microspheres, elastomeric balloons, flakes, platelets, fibers, rods, irregularly-shaped particles, or a mixture thereof. Similarly, the particle size of the filler is not considered critical, and may be or a narrow or broad distribution or range, but in general will be between about 0.250–250 $\mu$m, and more typically between about 1–100 $\mu$m.

The filler is loaded in the composition in a proportion sufficient to provide the level of electrical conductivity and EMI shielding effectiveness in the cured layers or other portions of member 32 which is desired for the intended application. For most applications, an EMI shielding effectiveness of at least 10 dB, and usually at least 20 dB, and preferably at least about 60 dB or higher, over a frequency range of from about 10 MHz to 10 GHz is considered acceptable. Such effectiveness translates to a filler proportion which generally is between about 10–80% by volume or 50–90% by weight, based on the total volume or weight, as the case may be, of the shielding formulation, and a surface resistance of about 0.10 $\Omega$/sq. or less, although it is known that comparable EMI shielding effectiveness may be achieved at lower conductivity levels through the use of an EMI absorptive or "lossy" filler such as a ferrite or nickel-coated graphite. As is also known, the ultimate shielding effectiveness of member 32 will vary based on the amount of the electrically-conductive or other filler material, and on the film thickness.

Additional fillers and additives may be included in the formulation depending upon the requirements of the particular application envisioned. Such fillers and additives may include conventional wetting agents or surfactants, pigments, dyes, and other colorants, opacifying agents, anti-foaming agents, anti-static agents, coupling agents such as titanates, chain extending oils, tackifiers, pigments, lubricants, stabilizers, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, silicates, and mica. Typically, these fillers and additives are blended or otherwise admixed with the formulation, and may comprise between about 0.05–80% or more by total volume thereof.

The formulation for the electrically-conductive member 32 may be compounded in a conventional mixing apparatus as a one or two-part admixture of the resin or resin system parts, filler, and pigment, dye, and/or other optional additive components. Depending upon the resin system, water or another inorganic or organic solvent or other diluent may be added to control the viscosity of the fluent admixture which may be adjusted for the application equipment or process to be used. The formulation, as mentioned, may be applied as a one or two-part system using conventional equipment to the surface and cured to form an adherent film or layer thereon. By "cured," it is meant that the film or other layer is polymerized, cross-linked, further cross-linked or polymerized, vulcanized, hardened, dried, or otherwise chemically or physically changed from a liquid or other fluent form into a solid phase. Such layer forms the adherent, shielding member 32 which may bond integrally to the surfaces of the inner member 30 via chemical, mechanical, electrostatic, van der Waals, or other forces.

Although the formation of electrically-conductive, shielding member 32 has been described herein primarily in conjunction with a coating application, it will be appreciated that other different types of member 32 may be employed without departing from the cope of the invention herein involved. For example, member 32 may be formed as is described in commonly-assigned U.S. Pat. No. 5,566,055 as an electrically-conductively-filled silicone or other elastomer layer which is over-molded onto the surfaces of the inner member 30. Alternatively, member 32 may be or clad, laminated, or metallized, such as by chemical, i.e., electroless, or electrolytic plating, vacuum or chemical vapor deposition, evaporation, sputterring, or plasma coating, onto the inner member surfaces 18 as a thin, i.e., 0.004–10 mil (0.0001–0.254 mm) metal film or foil layer. Also, the constituent portions 80, 82, and 84 of the electrically-conductive member 32 generally will be formed of the same electrically-conductive filled resin or other material, but alternatively may each be formed of different materials.

In the production of commercial quantities of gasket 20, individual gaskets may be sized by being stamped, punched, die-cut, kiss-cut, or otherwise sectioned from a larger sheet or roll stock of the composite material thereof. In this regard, inasmuch as the entirety, or substantially the entirety, of the z-axis conductivity of the gasket 20 is provided by the third layer portions 84, the outer edges or margin, referenced collectively at 90 in FIG. 1, of the gasket 20, which may be polygonal as shown or, alternatively, rectilinear, curvilinear, or other shape as defined by the given extents of the inner member 30 along the x and y-axes 50 and 52, and the outer circumferential surface, referenced at 92, of the inner member 30 which extends along the entirety, or substantially the entirety, of the outer margin 90, need not be sheathed, wrapped, or otherwise covered with conductive material. Rather, with the exception of the portions, one of which is referenced at 94, of the circumferential surface 92 formed by the peripheral surfaces 72 of the vias 70, substantially the entirety of the remainder thereof may be substantially free of a coating or other layer of the electrically-conductive member 32 without detracting from the performance of the gasket 20.

Similarly, one or more apertures, one of which is referenced at 96, may be stamped, punched, die-cut or otherwise formed the thickness dimension of the gasket 20 and the inner member 30 thereof for configuring the gasket 20 to the geometry required the intended application. As with the outer margin 90, the inner edges or margin, referenced at 97 in FIG. 1, of the gasket 20, as defined by the given extents of the aperture 96 along the x and y-axes 50 and 52, and the inner circumferential surface, referenced at 98, of the inner member 30 which extends along the entirety, or substantially the entirety, of the inner margin 97, need not be sheathed, wrapped, or otherwise covered with conductive material. Rather, and as before, with the exception of the portions, one of which is referenced at 99, of the circumferential surface 98 formed by the peripheral surfaces 72 of the vias 70, substantially the entirety of the remainder thereof may be substantially free of a coating or other layer of the electrically-conductive member 32 without detracting from the performance of the gasket 20.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. An EMI shielding gasket said gasket comprising:
    a resilient inner member having a first surface and a second surface opposite said first surface, each said first and said second surface extending along an x-axis and a y-axis disposed generally normal to said x-axis, and said first and as second surface defining a thickness dimension of said inner member therebetween which extends along a z-axis disposed generally normal to said x-axis and said y-axis, said inner member having a plurality of vias formed through the thickness dimension thereof; and
    an electrically-conductive member including:
        a first layer portion overlaying at least a part of said first surface and providing electrical conductivity thereacross in the direction of said x-axis and of said y-axis;
        a second layer portion overlaying at least a part of said second surface and providing electrical conductivity thereacross in the direction of said x-axis and of said y-axis; and
        one or more third portions each contained within a corresponding one of said vias and providing electrical conductivity between said first and said second layer portion in the direction of said z-axis,
    said gasket being compressible in the direction of the z-axis intermediate a first interface surface and a second interface surface for providing electric continuity therebetween.

2. The gasket of claim 1 wherein said inner member is formed of a sheet or strip of said resilient material, said first surface defining a first side of said sheet or strip, and said second surface defining a second side of said sheet or strip.

3. The gasket of claim 2 wherein each said first and said second side is generally planar.

4. The gasket of claim 1 wherein each said first and said second surface is generally planar.

5. The gasket of claim 1 wherein said inner member is formed of an elastomeric polymeric material.

6. The gasket of claim 5 wherein said elastomeric polymeric material is a foam.

7. The gasket of claim 5 wherein said elastomeric polymeric material is selected from the group consisting of polyethylenes, polypropylenes, polypropylene-EPDM blends, butadienes, styrene-butadienes, nitriles, chlorosulfonates, neoprenes, urethanes, silicones, and copolymers, blends, and combinations thereof.

8. The gasket of claim 7 wherein said elastomeric polymeric material is foamed.

9. The gasket of claim 1 wherein said x-axis defines a lengthwise dimension of said gasket of a given first extent, and said y-axis defines a widthwise dimension of said gasket of a given second extent, said thickness dimension of said gasket being small relative to said lengthwise and said widthwise dimension.

10. The gasket of claim 9 wherein said first extent of said lengthwise dimension is large relative to said second extent of said widthwise dimension.

11. The gasket of claim 1 wherein said first and said second layer portion, and said third layer portion of said electrically-conductive member each is formed, independently, of a material which comprises an admixture of:
    one or more resin components; and
    one or more electrically-conductive particulate fillers.

12. The gasket of claim 11 wherein said one or more resin components each is selected, independently, from the group consisting of acrylics, polyurethanes, epoxies, silicones, and copolymers and blends thereof.

13. The gasket of claim 11 wherein said one or more resin components each is selected, independently, from the group consisting of elastomeric polymeric materials.

14. The gasket of claim 11 wherein said admixture comprises between about 50–90% by weight of said one or more electrically-conductive particulate fillers.

15. The gasket of claim 11 wherein said first and said second layer portion of said electrically-conductive member each has a thickness, independently, of between about 0.1–10 mils (0.0025–0.25 mm).

16. The gasket of claim 1 wherein said gasket exhibits an EMI shielding effectiveness of at least about 60 dB substantially over a frequency range of between about 10 MHz and about 10 GHz.

17. The gasket of claim 1 wherein:
    said gasket has an electrical surface resistance of not greater than about 0.10 $\Omega$/sq. in the direction of said x-axis and of said y-axis; and
    said gasket has an electrical resistance of not greater than about 0.050 $\Omega$/in (0.050 $\Omega$/mm) in the direction of said z-axis.

18. The gasket of claim 1 wherein each of said vias has an inner peripheral surface, each of said third portions being formed as a layer coating at least a part of the inner peripheral surface of each said corresponding one of said vias.

19. The gasket of claim 18 wherein the inner peripheral surface of each of said vias is generally cylindrical.

20. The gasket of claim 19 wherein each of said vias has a diametric extent of between about 0.015–0.50 mils (0.38–12.7 mm).

21. The gasket of claim 18 wherein each of said third portions of said electrically-conductive member has a thickness, independently, of between about 0.1–10 mils (0.0025–0.25 mm).

22. The gasket of claim 1 wherein said electrically-conductive member is bonded to said inner member.

23. The gasket of claim 1 wherein substantially all of said electrical conductivity between said first and said second layer portion is provided by said third portions.

24. The gasket of claim 1 wherein:
    said first and second surface of said inner member each has a given extent along said x-axis and said y-axis defining an outer margin of said gasket;
    said inner member having an outer circumferential surface which extends along substantially the entirety of said outer margin; and
    wherein substantially the entirety of said outer circumferential surface not including said vias is substantially free of said electrically-conductive member.

25. The gasket of claim 24 wherein:

said inner member has at least one aperture formed through the thickness dimension thereof, said aperture having a given extent along said x-axis and said y-axis defining an inner margin of said gasket;

said inner member having an inner circumferential surface which extends along substantially the entirety of said inner margin; and wherein substantially the entirety of said inner circumferential surface not including said vias is substantially free of said electrically-conductive member.

26. The gasket of claim 1 wherein:

said first layer portion of said electrically-conductive member is coated on said first surface of said inner member; and said second layer portion of said electrically-conductive member is coated on said second surface of said inner member.

27. The gasket of claim 1 further comprising a reinforcement member, said reinforcement member having an inner surface bonded to said first surface of said inner member, and an outer surface, said first layer portion of said electrically-conductive member coating the outer surface of said reinforcement member, and said vias extending through said reinforcement member.

28. The gasket of claim 27 wherein said reinforcement member is formed of a layer of a material selected from the group consisting of foils, films, and fabrics.

29. The gasket of claim 1 wherein said third portions are continuous with said first and said second layer portion.

* * * * *